(12) United States Patent
Isik

(10) Patent No.: US 7,642,867 B2
(45) Date of Patent: Jan. 5, 2010

(54) SIMPLE TECHNIQUE FOR REDUCTION OF GAIN IN A VOLTAGE CONTROLLED OSCILLATOR

(75) Inventor: Tacettin Isik, Saratoga, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 96 days.

(21) Appl. No.: 11/693,660

(22) Filed: Mar. 29, 2007

(65) Prior Publication Data

US 2008/0238556 A1 Oct. 2, 2008

(51) Int. Cl.
*H03L 7/099* (2006.01)

(52) U.S. Cl. .......................................... 331/57; 331/185

(58) Field of Classification Search ................... 331/57, 331/185
See application file for complete search history.

(56) References Cited

U.S. PATENT DOCUMENTS 7,129,796 B2 * 10/2006 Goto ............................ 331/57
7,382,203 B2 * 6/2008 Kang ........................... 331/57

* cited by examiner

*Primary Examiner*—Joseph Chang
(74) *Attorney, Agent, or Firm*—Beaver, Hoffman & Harms, LLP

(57) ABSTRACT

A ring oscillator circuit having an odd plurality of inverter stages (i.e., 2N+1 stages). In accordance with one embodiment of the present invention, only one of the inverter stages is operated in response to a variable input voltage, while the remaining inverter stages are operated in response to a highly filtered constant input voltage. The inverter stages that operate in response to the constant input voltage oscillate at a base frequency. The inverter stage that operates in response to the variable input voltage causes the frequency of the output signal to deviate from the base frequency by an amount determined by the variable input voltage. In this manner, the variable voltage inverter stage implements frequency control for the ring oscillator. The gain of the ring oscillator circuit is reduced by a factor of (2N+1) with respect to the gain of a conventional ring oscillator.

8 Claims, 2 Drawing Sheets

SIMPLE TECHNIQUE FOR REDUCTION OF GAIN IN A VOLTAGE CONTROLLED OSCILLATOR

BACKGROUND OF THE INVENTION

1. Field of the Invention

The present invention relates to a voltage controlled oscillator (VCO). More specifically, the present invention relates to a VCO that includes a ring oscillator that exhibits an improved (reduced) gain.

2. Related Art

Voltage controlled oscillator (VCO) circuits are typically used to create frequency modulated (FM) signals. That is, a VCO circuit provides an output signal having a frequency ($f_{OUT}$) that varies in response to changes in an input supply voltage ($V_{IN}$). VCO circuits are the main building block for frequency modulation (FM) circuits and phase locked loop (PLL) circuits.

The gain ($K_{VCO}$) of a VCO circuit can be described mathematically as, $K_{VCO} = \Delta f_{OUT}/\Delta V_{IN}$, where $\Delta f_{OUT}$ represents the change in the output frequency and $\Delta V_{IN}$ represents the change in the input voltage. To obtain a desired modulation index, the gain of a VCO circuit should be appropriately low. However, the gain of a conventional VCO is typically too high to allow a frequency modulation system to be built using only a VCO circuit. Instead, frequency modulation systems are typically constructed using a low-frequency VCO circuit and one or more multiplier circuits. The output signal provided by the low-frequency VCO circuit is multiplied to obtain the desired high frequency output signal.

A ring oscillator is an inexpensive type of VCO circuit that typically has a large gain that is proportional to the frequency of operation. This causes two problems: (1) it is very difficult to achieve wide bandwidth frequency modulation with a reasonable input voltage, and (2) for a certain frequency modulation index, a small signal may be needed at the input, thereby reducing the signal-to-noise ratio, resulting in undesirable phase noise.

FIG. 1 is a block diagram of a conventional ring oscillator circuit 100. Ring oscillator 100 includes an odd number of identical inverting amplifier stages $10_1$-$10_{2N+1}$. In the described examples, the odd number of stages is represented by the value (2N+1), wherein N is an integer greater than or equal to 1. The frequency control input terminal of each amplifier stage is connected to receive a control voltage $V_{IN}$ from a common point P. Capacitor 20, which has a capacitance $C_f$, implements noise filtering of the control voltage $V_{IN}$. Ring oscillator 100 draws a total current $I_P$, which is equal to the sum of the currents $I_N$ through each of the 2N+1 inverting amplifier stages.

FIG. 2 is a circuit diagram illustrating conventional inverting amplifier stages $10_1$ and $10_2$, which are implemented by CMOS inverters that include PMOS transistors 201-202 and NMOS transistors 203-204. The current consumption of each of the inverting amplifier stages $10_1$-$10_{2N+1}$ can be represented by the following equation, $$I_N = C^* f^* V_{IN} \quad (1)$$

wherein 'C' represents the total node capacitance between two of the CMOS inverters (i.e., the sum of the PMOS and NMOS gate and drain capacitances), 'f' represents the frequency of the output signal provided by each of the inverting amplifier stages, and $V_{IN}$ represents the voltage swing of the output signal provided by each of the inverting amplifier stages.

Within each CMOS amplifying inverter stage, the PMOS transistor (e.g., PMOS transistor 201) is typically designed to have the same threshold voltage ($V_T$) and the same β value as the associated NMOS transistor (e.g., NMOS transistor 203). Note that the β value of a transistor is defined as $\mu^* C_{OX}^* W/L$, wherein μ is the mobility of the transistor, $C_{OX}$ is the gate capacitance of the transistor, W is the width of the transistor, and L is the length of the transistor. In this case, the current consumption ($I_N$) of each CMOS amplifying inverter stage can also be represented by the following equation.

$$I_N = \beta^*(0.5^* V_{IN} - V_T)^2 \quad (2)$$

Note that Equation (2) assumes that transitions in each inverting amplifier stage occur while the associated PMOS and NMOS transistors operate in a saturation condition, such that Equation (2) represents an approximation of transistor drain current. Equation (2) further relies on the fact that each transition occurs around ½ the input voltage $V_{IN}$.

Because there are 2N+1 identical CMOS inverters operating in an identical manner, the total current ($I_P$) drawn by ring oscillator circuit 100 is equal to the sum of the currents of the inverting amplifier stages. This relationship can be represented by the following equation.

$$I_P = (2N+1)^* I_N \quad (3)$$

Combining Equations (1) and (3) results in the following equation.

$$I_P = (2N+1)^*(C^* f^* V_{IN}) \quad (4)$$

Similarly, combining Equations (2) and (3) results in the following equation.

$$I_P = (2N+1)^* \beta^*(0.5^* V_{IN} - V_T)^2 \quad (5)$$

Taking the partial derivative of Equation (4) with respect to the input voltage $V_{IN}$ yields the following equations.

$$\partial I_P / \partial V_{IN} = \partial / \partial V_{IN}((2N+1)^* C^* f^* V_{IN}) \quad (6)$$

Because only the frequency f and the input voltage $V_{IN}$ vary with respect to changes in the input voltage $V_{IN}$, Equation (6) can be simplified as follows.

$$\partial I_P / \partial V_{IN} = (2N+1)^* C^* V_{IN}^* \partial f / \partial V_{IN} + (2N+1)^* C^* f^* \partial V_{IN} / \partial V_{IN} \quad (7)$$

$$\partial I_P / \partial V_{IN} = (2N+1)^* C^* V_{IN}^* \partial f / \partial V_{IN} + (2N+1)^* C^* f \quad (8)$$

Similarly, taking the partial derivative Equation (5) with respect to the input voltage $V_{IN}$ yields the following equations.

$$\partial I_P / \partial V_{IN} = \partial / \partial V_{IN}((2N+1)^* \beta^*(0.5^* V_{IN} - V_T)^2) \quad (9)$$

$$\partial I_P / \partial V_{IN} = (2N+1)^* \beta^* \partial / \partial V_{IN}(0.25^* V_{IN}^2 - V_{IN}^* V_T + V_T^2) \quad (10)$$

$$\partial I_P / \partial V_{IN} = (2N+1)^* \beta^*(0.5^* V_{IN} - V_T + 0) \quad (11)$$

$$\partial I_P / \partial V_{IN} = (2N+1)^* \beta^*(0.5^* V_{IN} - V_T) \quad (12)$$

Combining Equations (8) and (12) results in the following equation.

$$\beta^*(0.5^* V_{IN} - V_T) = C^* V_{IN}^* \partial f / \partial V_{IN} + C^* f \quad (13)$$

Solving Equation (13) for $\partial f / \partial V_{IN}$ results in the following equation, which represents the gain ($K_{100}$) of ring oscillator 100.

$$\partial f / \partial V_{IN} = [\beta^*(0.5^* V_{IN} - V_T) - C^* f] / (C^* V_{IN}) = K_{100} \quad (14)$$

The gain $K_{100}$ represented by Equation (14) is undesirably high for certain applications such as frequency modulation. This high gain results in the undesirable operating characteristics described above. It would therefore be desirable to have an improved ring oscillator circuit that exhibits a reduced gain with respect to ring oscillator 100. It would further be desirable if such an improved ring oscillator does not require the use of excessive additional circuitry.

SUMMARY

Accordingly, the present invention provides a ring oscillator circuit having an odd plurality of inverter stages (i.e., 2N+1 stages). In accordance with one embodiment of the present invention, only one of the inverter stages is operated in response to a variable input voltage ($V_{IN}$), while the remaining inverter stages are operated in response to a highly filtered constant input voltage ($V_C$). The inverter stages that operate in response to the constant input voltage oscillate at a base frequency. The inverter stage that operates in response to the variable input voltage causes the frequency of the output signal to deviate from the base frequency by an amount determined by the variable input voltage. In this manner, the variable voltage inverter stage implements frequency control for the ring oscillator.

The gain of the ring oscillator circuit of the present invention is reduced by a factor of (2N+1) with respect to the gain $K_{100}$ of conventional ring oscillator 100. The low gain of the ring oscillator circuit of the present invention enables direct wideband frequency modulation (without requiring separate multiplier circuits). The low gain of the ring oscillator circuit of the present invention also reduces phase noise and allows complex PLL bandwidth adjustments.

The present invention will be more fully understood in view of the following description and drawings.

DETAILED DESCRIPTION

Figure 1:
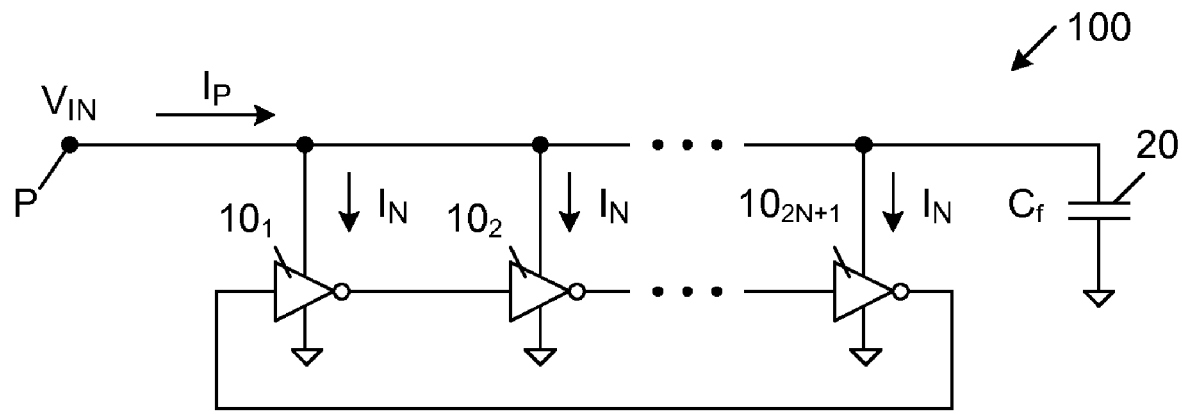
FIG. 1 is a block diagram of a conventional ring oscillator circuit.
Figure 2:
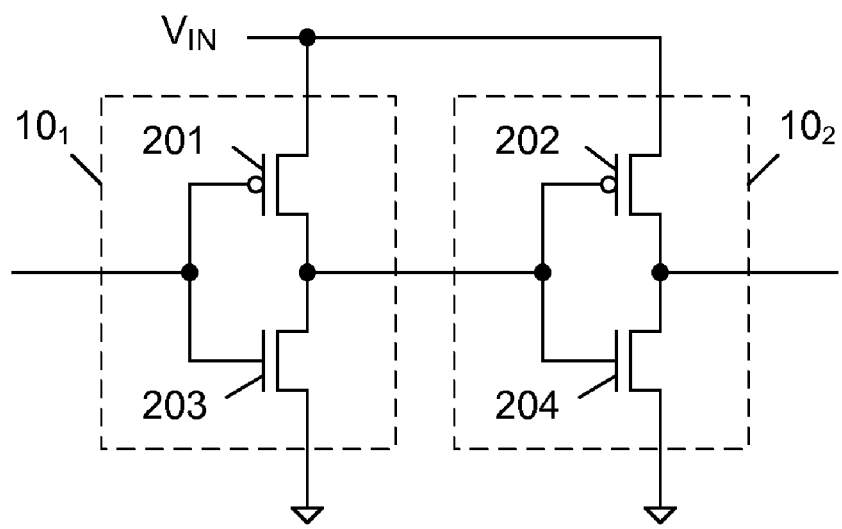
FIG. 2 is a circuit diagram illustrating conventional CMOS inverting amplifier stages present in the ring oscillator circuit of FIG. 1.
Figure 3:
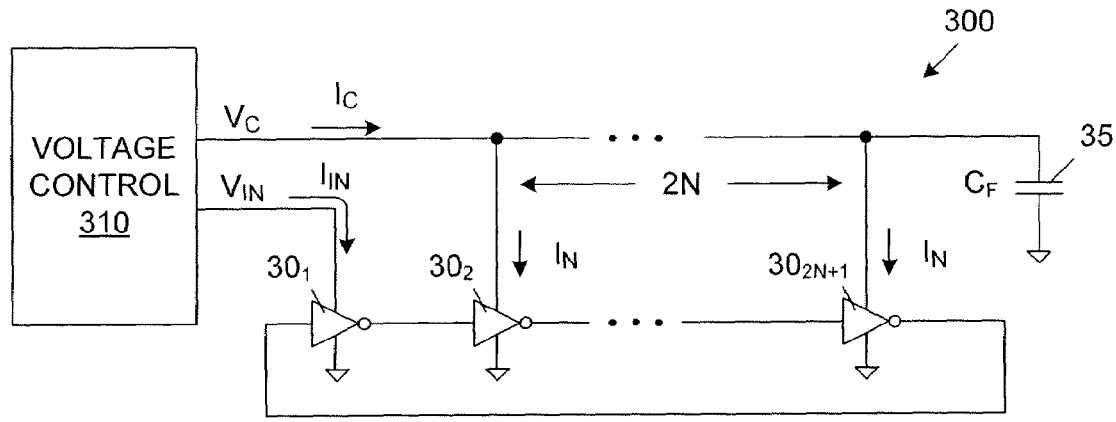
FIG. 3 is a block diagram of a reduced-gain ring oscillator circuit in accordance with one embodiment of the present invention.

FIG. 3 is a block diagram of a ring oscillator circuit 300 in accordance with one embodiment of the present invention. Ring oscillator circuit 300 includes an odd number of identical inverting amplifier stages $30_1$-$30_{2N+1}$. In the described examples, the odd number of stages is represented by the value (2N+1), wherein N is an integer greater than or equal to 1. In the described embodiments, inverting amplifier stages $30_1$-$30_{2N+1}$ are identical CMOS inverters, of the type illustrated in FIG. 2 above. Thus, each of the CMOS inverting amplifier stages $30_1$-$30_{2N+1}$ includes at least one PMOS transistor and at least one NMOS transistor. These PMOS and NMOS transistors are designed to have the same threshold voltage ($V_T$) and the same β value. Moreover, the total node capacitance (C) between each pair of connected CMOS inverting amplifier stages $30_1$-$30_{2N+1}$ is the same.

The frequency control input terminal of inverting amplifier stage $30_1$ is connected to receive a variable input voltage $V_{IN}$ from voltage control circuit 310. Thus, the output signal provided by inverting amplifier stage $30_1$ has a full voltage swing of $V_{IN}$. The current drawn by inverting amplifier stage $30_1$ is designated as current $I_{IN}$.

The current consumption of the inverting amplifier stage $30_1$ can be represented by each of the following equations.

$$I_{IN}=C*f*V_{IN} \quad (15)$$

$$I_{IN}=\beta*(0.5*V_{IN}-V_T)^2 \quad (16)$$

Equation (16) assumes that transitions in inverting amplifier stage $30_1$ occur while the associated PMOS and NMOS transistors operate in a saturation condition, and that each transition occurs around ½ the input voltage $V_{IN}$.

The frequency control input terminals of inverting amplifier stages $30_2$-$30_{2N+1}$ are connected to receive a constant input voltage $V_C$ from voltage control circuit 310. Capacitor 35, which has a capacitance $C_F$, implements noise filtering of the constant input voltage $V_C$. The output signals provided by inverting amplifier stages $30_2$-$30_{2N+1}$ have a full voltage swing of $V_C$. Each of the identical inverting amplifier stages $30_2$-$30_{2N+1}$ draws an identical current, which is designated as current $I_N$. The current $I_N$ consumed by each of the inverting amplifier stages $30_2$-$30_{2N+1}$ can be represented by each of the following equations.

$$I_N=C*f*V_C \quad (17)$$

$$I_N=\beta*(0.5*V_C-V_T)^2 \quad (18)$$

Note that frequency 'f', represents the same value in Equations (15) and (17). That is, each of the inverting amplifier stages $30_1$-$30_{2N+1}$ provides an output signal having the same frequency.

The total current ($I_C$) drawn by the 2N inverting amplifier stages $30_2$-$30_{2N+1}$ is equal to $2N*I_N$. The total current ($I_P$) drawn by ring oscillator circuit 300 is equal to the sum of currents $I_{IN}$ and $I_C$. The total current $I_P$ can therefore be represented by the following equation.

$$I_P=I_{IN}+(2N)*I_N \quad (19)$$

Combining Equations (15), (17) and (19) results in the following equation.

$$I_P=C*f*V_{IN}+(2N)*C*f*V_C \quad (20)$$

Similarly, combining Equations (16), (18) and (19) results in the following equation.

$$I_P=\beta*(0.5*V_{IN}-V_T)^2+(2N)*\beta*(0.5*V_C-V_T)^2 \quad (21)$$

Taking the partial derivative of Equation (20) with respect to the input voltage $V_{IN}$ yields the following equation.

$$\partial I_P/\partial V_{IN}=\partial/\partial V_{IN}(C*f*V_{IN})+\partial/\partial V_{IN}(2N*C*f*V_C) \quad (22)$$

Because only the frequency f and the input voltage $V_{IN}$ vary with respect to changes in the input voltage $V_{IN}$, Equation (22) can be simplified as follows.

$$\partial I_P/\partial V_{IN}=C*V_{IN}*\partial f/\partial V_{IN}+C*f*\partial V_{IN}/\partial V_{IN}+ \\ 2N*C*V_C*\partial f/\partial V_{IN} \quad (23)$$

$$\partial I_P/\partial V_{IN}=C*V_{IN}*\partial f/\partial V_{IN}+C*f+2N*C*V_C*\partial f/\partial V_{IN} \quad (24)$$

Taking the partial derivative of Equation (21) with respect to the input voltage $V_{IN}$ yields the following equations.

$$\partial I_P/\partial V_{IN}=\beta*(0.5*V_{IN}-V_T)^2\partial/\partial V_{IN}+(2N)*\beta*\partial/\partial V_{IN} \\ (0.5*V_C-V_T)^2 \quad (25)$$

$$\partial I_P/\partial V_{IN}=\beta*\partial/\partial V_{IN}(0.25*V_{IN}^2-V_{IN}*V_T+V_T^2)+ \\ (2N)*\beta*\partial/\partial V_{IN}(0.25*V_C^2-V_C*V_T+V_T^2) \quad (26)$$

$$\partial I_P/\partial V_{IN}=\beta*(0.5*V_{IN}-V_T+0)+(2N)*\beta*(0-0+0) \quad (27)$$

$$\partial I_P/\partial V_{IN}=\beta*(0.5*V_{IN}-V_T) \quad (28)$$

Combining Equations (24) and (28) provides the following equation.

$$\beta*(0.5*V_{IN}-V_T)=C*V_{IN}*\partial f/\partial V_{IN}+C*f+2N*C*V_C*\partial f/\partial V_{IN} \quad (29)$$

Solving Equation (29) for $\partial f/\partial V_{IN}$ results in the following equation, which represents the gain ($K_{300}$) of ring oscillator circuit 300.

$$\partial f/\partial V_{IN}=[\beta*(0.5*V_{IN}-V_T)-C*f]/(C*V_{IN}+2N*C*V_C)=K_{300} \quad (30)$$

The gain $K_{300}$ of ring oscillator circuit 300 therefore has the following relationship with respect to the gain $K_{100}$ of conventional ring oscillator circuit 100.

$$K_{100}/K_{300}=(C*V_{IN}+2N*C*V_C)/(C*V_{IN}) \quad (31)$$

$$K_{100}/K_{300}=1+(2N*V_C/V_{IN}) \quad (32)$$

In accordance with one embodiment of the present invention, the constant input voltage $V_C$ is selected to provide an output signal having a predetermined base frequency of oscillation $f_B$ (assuming that the variable input voltage $V_{IN}$ has a potential equal to $V_C$). The variable input voltage $V_{IN}$ is then varied about the constant input voltage $V_C$ to adjust the frequency of the output signal. That is, variations in the variable input voltage $V_{IN}$ cause the frequency of the output signal to vary about the base frequency $f_B$. In this embodiment, the variable input voltage $V_{IN}$ can be approximated as being equal to the constant voltage $V_C$. This approximation enables Equation (32) to be simplified as follows.

$$K_{100}/K_{300}=(1+2N) \quad (33)$$

Thus, it is seen that the gain $K_{300}$ of ring oscillator circuit 300 is less than the gain $K_{100}$ of conventional ring oscillator circuit 100 by a factor of (1+2N). For example, if ring oscillator circuits 100 and 300 each include fifteen inverting amplifier stages (i.e., N=7), then the gain $K_{300}$ of ring oscillator circuit 300 is 15 times less than the gain $K_{100}$ of ring oscillator circuit 100.

Advantageously, this reduced gain allows ring oscillator circuit 300 to implement high-frequency modulation without requiring the use of frequency multiplier circuits. The reduced gain of ring oscillator circuit 300 also enables wide bandwidth frequency modulation with a reasonable input voltage. The reduced gain of ring oscillator circuit 300 enables frequency modulation to be implemented, without requiring the use of small input voltage signals. As a result, the signal-to-noise ratio of ring oscillator circuit 300 is maintained at a level that minimizes undesirable phase noise.

Figure 4:
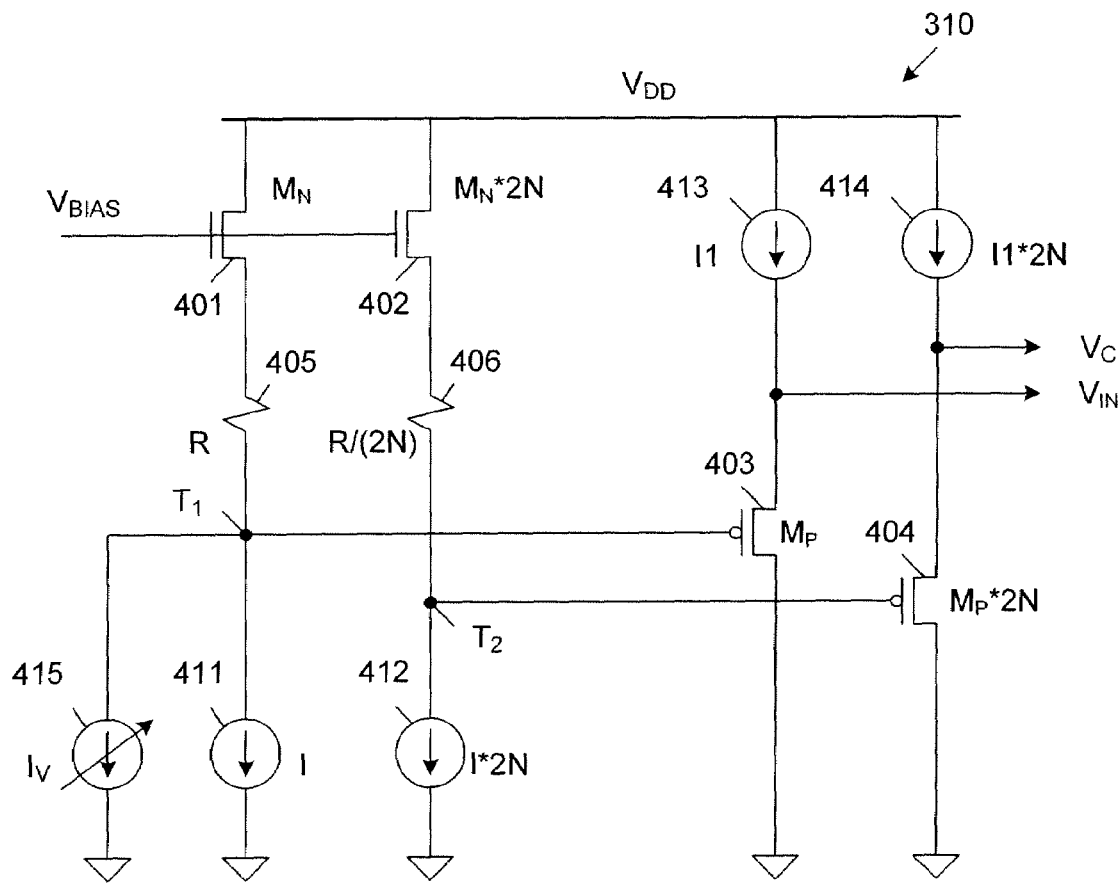
FIG. 4 is a circuit diagram of a voltage control circuit used in the ring oscillator circuit of FIG. 3 in accordance with one embodiment of the present invention.

FIG. 4 is a circuit diagram of voltage control circuit 310 in accordance with one embodiment of the present invention. Voltage control circuit 310 provides the variable input voltage $V_{IN}$ and the constant input voltage $V_C$. Voltage control circuit 310 includes NMOS transistors 401-402, PMOS transistors 403-404, resistors 405-406, constant current sources 411-414 and variable current source 415.

NMOS transistor 401 and resistor 405 are coupled in series between the $V_{DD}$ voltage supply terminal and control terminal $T_1$. The gate of NMOS transistor 401 is coupled to receive a bias voltage $V_{BIAS}$. Constant current source 411 and variable current source 415 are connected in parallel between control terminal $T_1$ and ground. Thus, NMOS transistor 401 is connected in a source-follower configuration between the $V_{DD}$ voltage supply terminal and control terminal $T_1$. Control terminal $T_1$ is also coupled to the gate of PMOS transistor 403. PMOS transistor 403 is connected in a source-follower configuration between the ground supply terminal and constant current source 413. The variable input voltage $V_{IN}$ is provided at the source of PMOS transistor 403.

Similarly, NMOS transistor 402 and resistor 406 are coupled in series between the $V_{DD}$ voltage supply terminal and control terminal $T_2$. The gate of NMOS transistor 402 is coupled to receive a bias voltage $V_{BIAS}$. Constant current source 412 is connected between control terminal $T_2$ and ground. Thus, NMOS transistor 402 is connected in a source-follower configuration between the $V_{DD}$ voltage supply terminal and control terminal $T_2$. Control terminal $T_2$ is also coupled to the gate of PMOS transistor 404. PMOS transistor 404 is connected in a source-follower configuration between the ground supply terminal and constant current source 414. The constant input voltage $V_C$ is established at the source of PMOS transistor 404. Due to the cascaded source-follower transistors 402 and 404, the constant input voltage $V_C$ will be approximately equal to the bias voltage $V_{BIAS}$.

The gates of NMOS transistors 401 and 402 are commonly coupled to receive a bias voltage $V_{BIAS}$. NMOS transistors 401 and 402 are sized such that NMOS transistor 402 is 2*N times as large as NMOS transistor 401. Resistors 405 and 406 are sized such that the resistance of resistor 406 is 1/(2N) times the resistance of resistor 405. The constant current source 412 is sized to draw a current that is 2*N times the current drawn by constant current source 411. PMOS transistors 403 and 404 are sized such that PMOS transistor 404 is 2*N times as large as PMOS transistor 403. The constant current source 414 is sized to draw a current that is 2*N times the current drawn by constant current source 413.

Variable current source 415 is initially controlled to draw no current. The above-described scaling of the various circuit elements causes the variable input voltage $V_{IN}$ to be equal to the constant input voltage $V_C$ under these conditions. Adjusting the bias voltage $V_{BIAS}$ will adjust both the variable input voltage $V_{IN}$ and the constant input voltage $V_C$, thereby adjusting the base frequency $f_B$ of ring oscillator circuit 300. The bias voltage $V_{BIAS}$ is held at a constant value after the base frequency $f_B$ has been selected.

After the desired base frequency has been selected, the variable current source 415 may be adjusted to draw (or supply) current. Adjusting the current ($I_V$) of variable current source 415 will adjust the voltage on the gate of PMOS transistor 403, thereby adjusting the variable voltage $V_{IN}$ provided on the source of PMOS transistor 403. When current is drawn by variable current source 415, the adjusted voltage $V_{IN}$ will perturb the oscillation of ring oscillator circuit 300 with a gain that is (1+2N) less than conventional ring oscillator circuit 100. The voltage shift due to the gate-to-source voltage of PMOS transistor 404 is typically compensated by a phase locked loop (PLL), in which the ring oscillator circuit 300 is used.

In other words, assuming the voltages at the sources of NMOS transistors 401 and 402 are same due to the fact that their gate voltages are same ($V_{BIAS}$) and the drain currents and the sizes of these NMOS transistors are scaled perfectly, then the current I of current source 411 and the current I*2N of current source 412 result in the same voltage drop across the resistance R of resistor 405 and the resistance R/(2N) of resistor 406, respectively, if the variable current $I_V$ is zero. Therefore, the voltages at the gates and the sources of PMOS transistors 403 and 404 expected to be the same because the sizes and drain currents of these PMOS transistors 403 and 404 are scaled perfectly. Any non-zero $I_V$ current introduced by variable current source 415 will result in an additional voltage drop of $I_V*R$ across resistor 405, which will establish a voltage deviation at the gate of PMOS transistor 403 with respect to the voltage at the gate of PMOS transistor 404, and will be reflected to the variable input voltage $V_{IN}$ directly.

Although the present invention has been described in connection with several embodiments, it is understood that this invention is not limited to the embodiments disclosed, but is capable of various modifications which would be apparent to one of ordinary skill in the art. For example, although the present invention has been described in connection with a ring oscillator having a single inverter stage configured to operate in response to a variable control voltage, and the remaining inverter stages configured to operate in response to a constant control voltage, it is understood that in other embodiments, more than one inverter stage may be configured to operate in response to the variable control voltage. However, it is understood that each additional inverter stage configured to operate in response to the variable control voltage will undesirably increase the gain of the ring oscillator circuit. Moreover, although the present invention has been described as a current controlled oscillator that changes the output frequency in response to a varying current input ($I_V$), it is understood that the variable current source 415 can be replaced with a voltage-to-current converter, thereby enabling the output frequency to be changed in response to a varying input voltage, thereby keeping the voltage controlled oscillator concept intact. Thus, the invention is limited only by the following claims.

I claim:

1. A ring oscillator circuit comprising:
    a plurality of inverting circuits coupled in a ring; and
    a voltage control circuit coupled to the inverting circuits and configured to apply a variable input voltage to a frequency control input of one of the inverting circuits, and a constant input voltage to frequency control inputs of a plurality of the inverting circuits, wherein each of the plurality of inverting circuits is coupled to receive either the variable input voltage or the constant input voltage, but not both.

2. A ring oscillator circuit comprising:
    a plurality of inverting circuits coupled in a ring; and
    a voltage control circuit coupled to the inverting circuits and configured to apply a variable input voltage to a frequency control input of one and only one of the inverting circuits, the voltage control circuit further being configured to apply a constant input voltage to frequency control inputs of all of the other inverting circuits.

3. The ring oscillator circuit of claim 1, wherein the voltage control circuit comprises means for selecting the constant input voltage.

4. A method for operating a ring oscillator circuit, comprising:
    operating a first inverter circuit of the ring oscillator circuit in response to a variable input voltage, wherein the variable input voltage is provided as an output voltage of the first inverter circuit; and
    operating a plurality of inverter circuits of the ring oscillator circuit in response to a constant input voltage, wherein the constant input voltage is provided as an output voltage of each of the plurality of inverter circuits.

5. The method of claim 4, wherein the variable input voltage is different than the constant input voltage.

6. A method for operating a ring oscillator circuit, comprising:
    operating a first inverter circuit of the ring oscillator circuit in response to a variable input voltage,
    operating a plurality of inverter circuits of the ring oscillator circuit in response to a constant input voltage; and
    operating the first inverter circuit and the plurality of inverter circuits in response to a ground supply voltage, wherein the first inverter circuit provides an output signal that swings between the variable input voltage and ground, and wherein each of the plurality of inverter circuits provides an output signal that swings between the constant input voltage and ground.

7. The method of claim 4, further comprising operating a second inverter circuit of the ring oscillator circuit in response to the variable input voltage.

8. A method for operating a ring oscillator circuit, comprising:
    operating a first inverter circuit of the ring oscillator circuit in response to a variable input voltage;
    operating a plurality of inverter circuits of the ring oscillator circuit in response to a constant input voltage;
    initially adjusting the variable input voltage to be equal to the constant input voltage, thereby defining a base operating frequency of the ring oscillator circuit; and then
    adjusting the variable input voltage to be different than the constant input voltage, thereby causing the ring oscillator circuit to operate at a different frequency than the base operating frequency.

* * * * *